(12) United States Patent
Tsai et al.

(10) Patent No.: US 10,236,142 B2
(45) Date of Patent: Mar. 19, 2019

(54) LUMINOUS KEYBOARD

(71) Applicant: Primax Electronics Ltd., Taipei (TW)

(72) Inventors: Lei-Lung Tsai, Taipei (TW); Ying-Te Chiang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 15/813,407

(22) Filed: Nov. 15, 2017

(65) Prior Publication Data

US 2019/0027326 A1 Jan. 24, 2019

(30) Foreign Application Priority Data

Jul. 21, 2017 (TW) .............................. 106124637 A

(51) Int. Cl.
| | |
|---|---|
| H01H 13/83 | (2006.01) |
| H01H 9/18 | (2006.01) |
| H01H 3/12 | (2006.01) |
| H01H 13/705 | (2006.01) |
| H03K 17/98 | (2006.01) |

(52) U.S. Cl.
CPC ............ *H01H 13/83* (2013.01); *H01H 9/182* (2013.01); *H01H 13/705* (2013.01); *H03K 17/98* (2013.01); *H01H 3/125* (2013.01); *H01H 2219/036* (2013.01); *H01H 2219/058* (2013.01); *H01H 2219/062* (2013.01); *H01H 2219/066* (2013.01); *H01H 2239/006* (2013.01); *H03K 2217/96079* (2013.01)

(58) Field of Classification Search
CPC .... H01H 13/83; H01H 9/181; H01H 2219/06; H01H 2219/056; H01H 2219/054; H01H 2219/064; H04M 1/22; G02B 6/0031; H03K 2217/96079
See application file for complete search history.

(56) References Cited

U.S. PATENT DOCUMENTS

| | | | | |
|---|---|---|---|---|
| 8,168,905 B2* | 5/2012 | Yang | ...................... | H01H 13/83 200/314 |
| 9,040,856 B2* | 5/2015 | Chen | ...................... | H01H 13/83 200/310 |
| 9,214,301 B2* | 12/2015 | Chen | ...................... | H01H 13/83 |

* cited by examiner

*Primary Examiner* — Vanessa Girardi
(74) *Attorney, Agent, or Firm* — Kirton McConkie; Evan R. Witt

(57) ABSTRACT

A luminous keyboard includes a key structure, a supporting plate, a switch circuit board, a light guide plate, a top-view light-emitting element and a reflecting element. The supporting plate includes a supporting plate opening. The supporting plate is located under the key structure. The switch circuit board is located over the supporting plate. The light guide plate is located under the supporting plate, and includes a light guide plate opening. The top-view light-emitting element is inserted into the light guide plate opening. The reflecting element is arranged between the top-view light-emitting element and the key structure. After the light beam is transmitted through the supporting plate opening, the light beam is transmitted through the switch circuit board and reflected to the light guide plate by the reflecting element. Then, the light beam is guided to a periphery region of the key structure by the light guide plate.

7 Claims, 7 Drawing Sheets

LUMINOUS KEYBOARD

FIELD OF THE INVENTION

The present invention relates to a keyboard, and more particularly to a luminous keyboard with an illuminating function.

BACKGROUND OF THE INVENTION

Generally, the widely-used peripheral input device of a computer system includes for example a mouse device, a keyboard, a trackball device, or the like. Via the keyboard, characters and symbols can be inputted into the computer system directly. As a consequence, most users and most manufacturers of input devices pay much attention to the development of keyboards.

FIG. 1 is a schematic top view illustrating the outer appearance of a conventional keyboard. As shown in FIG. 1, there are plural keys 10 on a surface of the conventional keyboard 1. These keys 10 are classified into several types, e.g. ordinary keys 101, numeric keys 102 and function keys 103. When one of these keys 10 is depressed by the user's finger, a corresponding signal is issued to the computer, and thus the computer executes a function corresponding to the depressed key. For example, when an ordinary key 101 is depressed, a corresponding English letter or symbol is inputted into the computer. When a numeric key 102 is depressed, a corresponding number is inputted into the computer. In addition, the function keys 103 (F1~F12) can be programmed to provide various functions. For example, the conventional keyboard 1 is a keyboard for a notebook computer.

With the maturity of the computing technologies, the keyboard manufacturers make efforts in designing novel keyboards with special functions in order to meet diversified requirements of different users. For this reason, luminous keyboards are favored by users. Hereinafter, the inner structure of the luminous keyboard will be illustrated in more details. FIG. 2 is a schematic cross-sectional view illustrating a conventional luminous keyboard. As shown in FIG. 2, the conventional luminous keyboard 2 comprises plural key structures 20, a membrane switch circuit member 21, a light guide plate 22, an illumination module 23, a supporting plate 24 and a reflecting plate 25. Each key structure 20 comprises a keycap 201, a scissors-type connecting element 202 and an elastic element 203. From top to bottom, the keycap 201, the scissors-type connecting element 202, the elastic element 203, the membrane switch circuit member 21, the supporting plate 24, the light guide plate 22 and the reflecting plate 25 of the conventional luminous keyboard 2 are sequentially shown. The supporting plate 24 is arranged between the membrane switch circuit member 21 and the light guide plate 22 for supporting the keycap 201, the scissors-type connecting element 202, the elastic element 203 and the membrane switch circuit member 21.

The keycap 201 of the key structure 20 is exposed outside the conventional luminous keyboard 2. Consequently, the keycap 201 can be depressed by the user. The scissors-type connecting element 202 is used for connecting the keycap 201 and the supporting plate 24. The elastic element 203 is penetrated through the scissors-type connecting element 202. In addition, both ends of the elastic element 203 are contacted with the keycap 201 and the membrane switch circuit member 21, respectively. The membrane switch circuit member 21 comprises an upper wiring board 211, a separation layer 212, and a lower wiring board 213. The upper wiring board 211 comprises plural upper conductive parts 2111. The separation layer 212 is located under the upper wiring board 211. Moreover, the separation layer 212 comprises plural separation layer openings 2121 corresponding to the plural upper conductive parts 2111. The lower wiring board 213 is located under the separation layer 212. Moreover, the lower wiring board 213 comprises plural lower conductive parts 2131 corresponding to the plural upper conductive parts 2111. Moreover, plural key switches 214 are defined by the plural lower conductive parts 2131 and the plural upper conductive parts 2111 collaboratively. The upper wiring board 211, the separation layer 212 and the lower wiring board 213 are all made of a light-transmissible material. The light-transmissible material is for example polycarbonate (PC) or polyethylene (PE). Consequently, the upper wiring board 211, the separation layer 212 and the lower wiring board 213 are light-transmissible.

The illumination module 23 comprises an illumination circuit board 231 and plural light-emitting elements 232. For clarification and brevity, only two light-emitting elements 232 are shown in the drawing. The illumination circuit board 231 is located under the membrane switch circuit member 21 for providing electric power to the plural light-emitting elements 232. The plural light-emitting elements 232 are disposed on the illumination circuit board 231. In addition, the plural light-emitting elements 232 are inserted into plural reflecting plate openings 251 of the reflecting plate 25 and plural light guide plate openings 221 of the light guide plate 22, respectively. By acquiring the electric power, the plural light-emitting elements 232 are driven to emit plural light beams B. Moreover, the plural light beams B are introduced into the light guide plate 22. For example, the plural light-emitting elements 232 are side-view light emitting diodes. The light guide plate 22 is used for guiding the plural light beams B to the keycaps 201. The reflecting plate 25 is located under the light guide plate 22 for reflecting the plural light beams B. Consequently, the plural light beams B are directed upwardly, and the utilization efficiency of the light beams B is enhanced. The two lateral edges 252 of the reflecting plate 25 are bent upwardly to enclose plural lateral edges 222 of the light guide plate 22. For clarification and brevity, only one lateral edge 252 of the reflecting plate 25 is shown in the drawing. Due to the lateral edges 252 of the reflecting plate 25, the problem of causing light leakage through the lateral edges 222 of the light guide plate 22 will be eliminated.

In the conventional luminous keyboard 2, each keycap 201 has a light-outputting zone 2011. The light-outputting zone 2011 is located at a character region or a symbol region of the keycap 201. Moreover, the position of the light-outputting zone 2011 is aligned with the position of a corresponding light-guiding dot 223 of the light guide plate 22. The light beams can be guided upwardly to the light-outputting zone 2011 by the corresponding light-guiding dot 223. After the plural light beams B are transferred within the light guide plate 22 and projected on the light-guiding dots 223, the light beams B are guided by the light-guiding dots 223 and projected upwardly. The upwardly-projected portions of the light beams B are sequentially transmitted through plural supporting plate openings 241 of the supporting plate 24 and the membrane switch circuit member 21 and transmitted through the plural light-outputting zones 2011 of the keycaps 201 so as to illuminate the character regions or the symbol regions of the keycaps 201. Under this circumstance, the illuminating function is achieved.

However, the conventional luminous keyboard 2 still has some drawbacks. For example, all of the key structures of the luminous keyboard 2 are simultaneously illuminated. If the user intends to illuminate the key structure A but not illuminate the key structure B, the use of the luminous keyboard 2 cannot meet the user's requirement. For meeting the user's requirement, the luminous keyboard uses top-view light emitting diodes. That is, a single top-view light emitting diode is located under the keycap of one key structure. Since the illumination of each top-view light emitting diode is independently controlled, the use of the top-view light emitting diode can meet the user's requirement. The light beam emitted by the top-view light emitting diode is projected upwardly to the corresponding keycap. Since the light beam from the top-view light emitting diode is very centralized, the luminance uniformity is usually unsatisfied.

Therefore, there is a need of providing a luminous keyboard for controlling illumination of individual keys and producing enhanced luminance uniformity.

SUMMARY OF THE INVENTION

An object of the present invention provides a luminous keyboard for controlling illumination of individual keys and producing enhanced luminance uniformity.

In accordance with an aspect of the present invention, there is provided a luminous keyboard. The luminous keyboard includes a key structure, a supporting plate, a switch circuit board, a light guide plate, a top-view light-emitting element and a reflecting element. The key structure is exposed outside the luminous keyboard. The supporting plate is located under the key structure and connected with the key structure. The supporting plate includes a supporting plate opening. The switch circuit board is located over the supporting plate. When the switch circuit board is triggered by the key structure, a key signal is generated. The light guide plate is located under the supporting plate. The light guide plate includes a light guide plate opening. The top-view light-emitting element is located under the key structure and inserted into the light guide plate opening. The top-view light-emitting element emits a light beam. The reflecting element is aligned with the top-view light-emitting element, and arranged between the key structure and the top-view light-emitting element. After the light beam is transmitted through the supporting plate opening, the light beam is reflected to the light guide plate by the reflecting element and the light beam is guided to a periphery region of the key structure by the light guide plate.

In an embodiment, the reflecting element is disposed on a top surface of the switch circuit board. After the light beam is transmitted through the supporting plate opening and the switch circuit board, the light beam is reflected to the light guide plate by the reflecting element and the light beam is guided to the periphery region of the key structure by the light guide plate.

From the above descriptions, the luminous keyboard of the present invention uses the top-view light-emitting elements. The top-view light-emitting elements and the key structures are in a one-to-one relationship. Consequently, the illumination of individual key structures can be controlled. Moreover, the top-view light-emitting elements are inserted into the corresponding light guide plate openings and located under the supporting plate openings and the switch circuit board. The first reflecting element is arranged between the key structure and the top-view light-emitting element. Consequently, the light beam is not directly projected to the key structure. After the light beam emitted by the top-view light-emitting element is transmitted through the supporting plate opening, the light beam is transmitted through the switch circuit board and reflected to the light guide plate by the reflecting element. Then, the light beam is guided by the light guide plate and projected to the periphery region of the key structure. Consequently, the luminous keyboard of the present invention can produces enhanced luminance uniformity.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For overcoming the drawbacks of the conventional technology, the present invention provides a luminous keyboard. The structure of the luminous keyboard will be described as follows.

Figure 1:
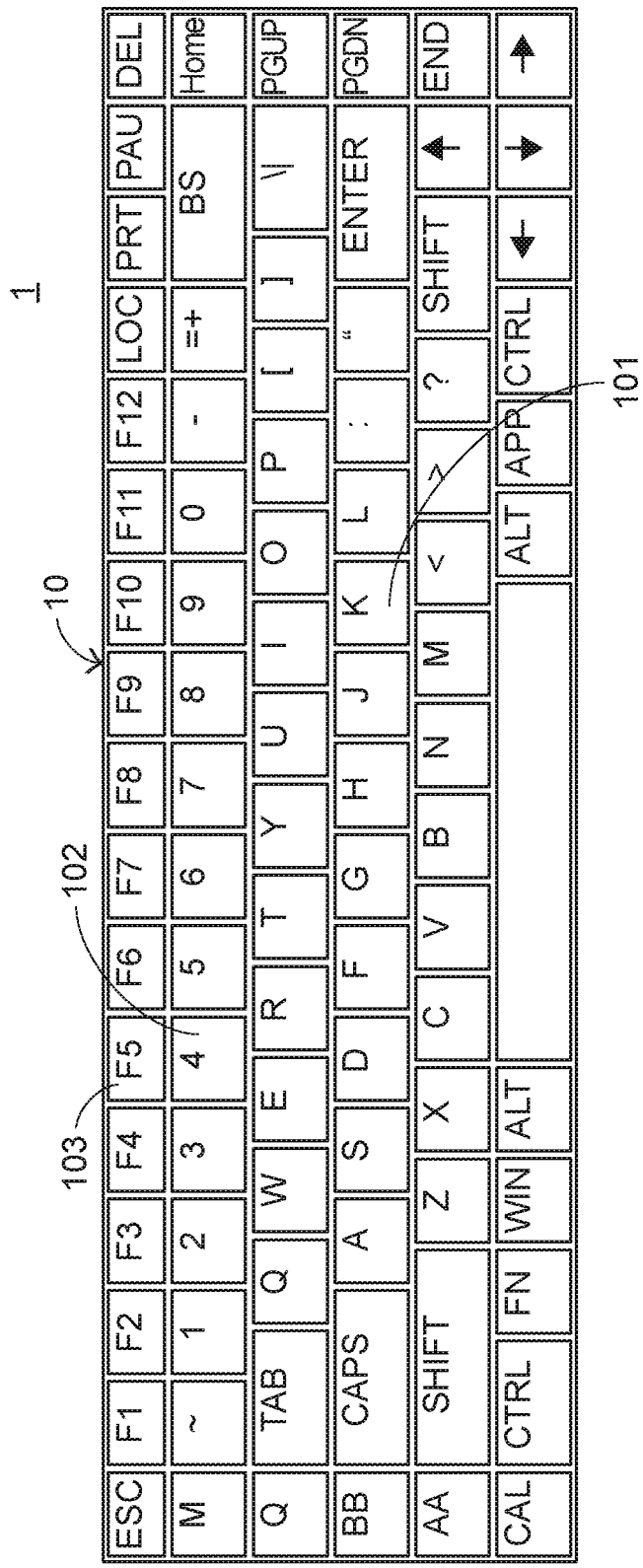
FIG. 1 is a schematic top view illustrating the outer appearance of a conventional keyboard.
Figure 2:
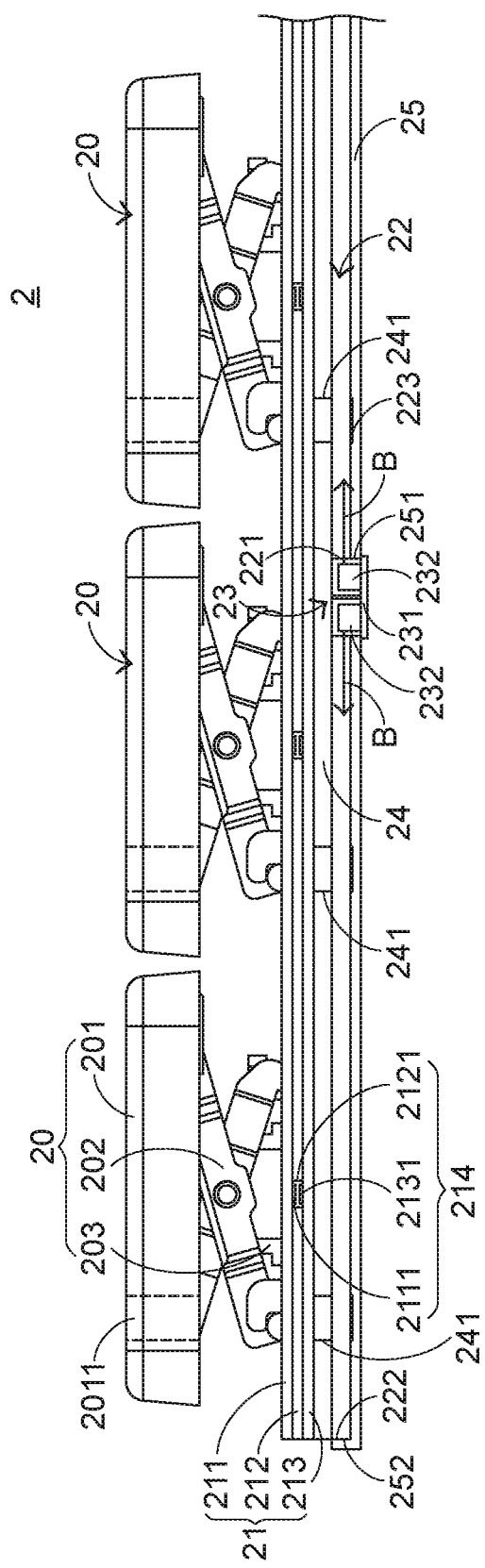
FIG. 2 is a schematic cross-sectional view illustrating a conventional luminous keyboard.
Figure 3:
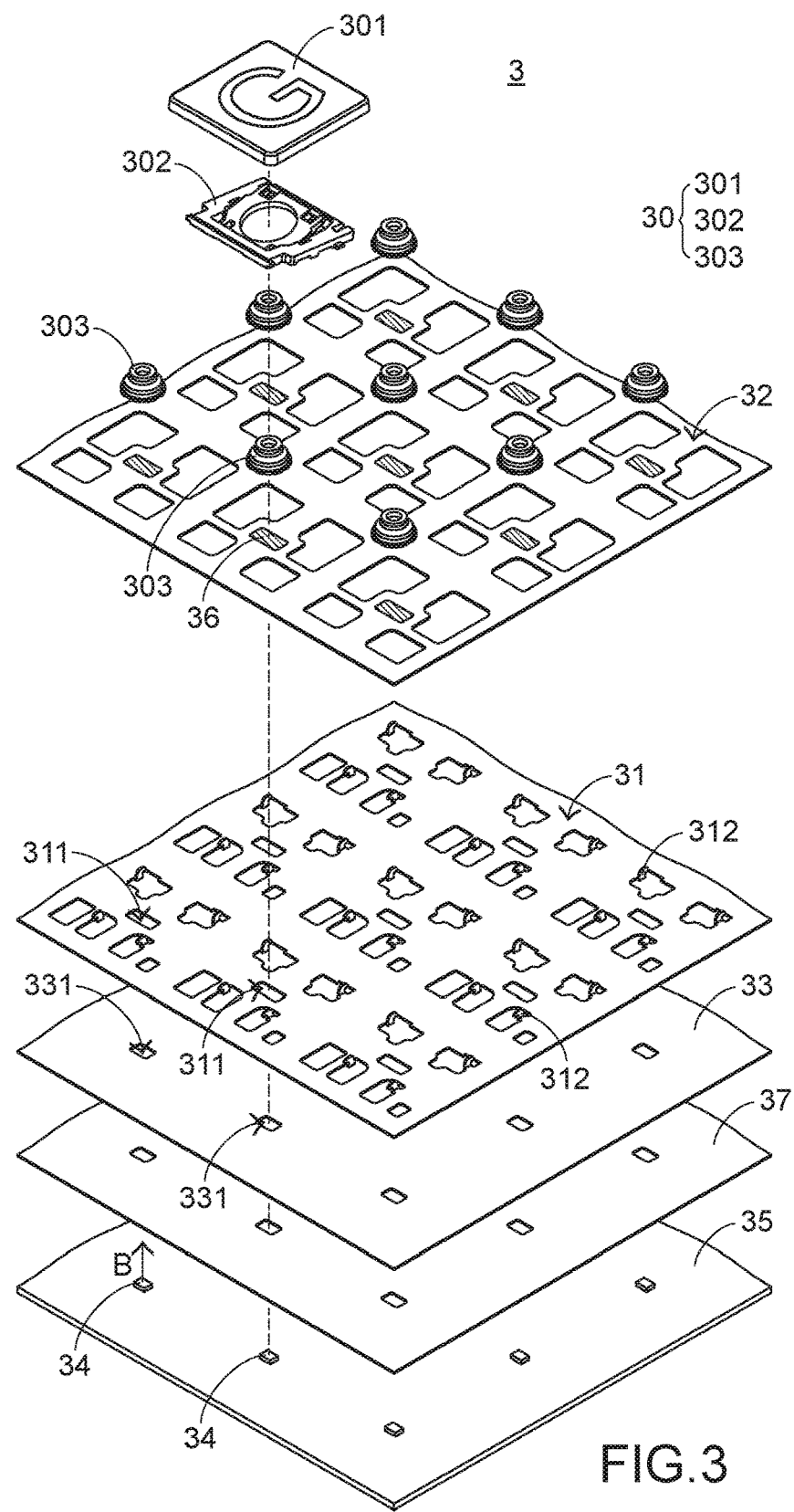
FIG. 3 is a schematic exploded view illustrating a portion of a luminous keyboard according to a first embodiment of the present invention.

FIG. 3 is a schematic exploded view illustrating a portion of a luminous keyboard according to a first embodiment of the present invention. As shown in FIG. 3, the luminous keyboard 3 comprises plural key structures 30, a supporting plate 31, a switch circuit board 32, a light guide plate 33, plural top-view light-emitting elements 34, an illumination circuit board 35, plural first reflecting elements 36 and a second reflecting element 37. For succinctness, only one key structure 30 is shown in FIG. 3. Each top-view light-emitting element 34 is aligned with one key structure 30. The plural key structures 30 are exposed outside the luminous keyboard 3. The supporting plate 31 is located under the plural key structures 30 and connected with the plural key structures 30. Moreover, the supporting plate 31 comprises plural supporting plate openings 311 and plural hooks 312 corresponding to the plural key structures 30. The switch circuit board 32 is disposed on the supporting plate 31. When the switch circuit board 32 is triggered by at least one of the plural key structures 30, a corresponding key signal is generated. The light guide plate 33 is located under the supporting plate 31. Moreover, the light guide plate 33 comprises plural light guide plate openings 331 corresponding to the plural key structures 30.

The plural top-view light-emitting elements 34 are located under the corresponding key structures 30 and inserted into the corresponding light guide plate openings 331. The plural top-view light-emitting elements 34 emit plural light beams B. The illumination circuit board 35 is located under the light guide plate 33 for supporting the plural top-view light-emitting elements 34. Moreover, the illumination circuit board 35 is electrically connected with the plural top-view light-emitting elements 34. The first reflecting element 36 is aligned with the corresponding top-view light-emitting element 34 and arranged between the corresponding top-view light-emitting element 34 and the corresponding key structure 30. The first reflecting element 36 is used for reflecting the light beam B, so that the light beam B is not directly projected to the key structure 30. The second reflecting element 37 is arranged between the light guide plate 33 and the illumination circuit board 35. The second reflecting element 37 is used for reflecting the light beams B. In an embodiment, the plural top-view light-emitting elements 34 are top-view light emitting diodes, and the illumination circuit board 35 is a printed circuit board (PCB) or a flexible printed circuit (FPC).

The first reflecting element 36 and the second reflecting element 37 are reflecting plates or reflective ink layers. In case that the second reflecting element 37 is the reflective ink layer, the reflective ink layer is printed or coated on a bottom surface of the light guide plate 33 or a top surface of the illumination circuit board 35. In case that the second reflecting element 37 is the reflecting plate, the reflecting plate comprises plural reflecting plate openings. After the plural top-view light-emitting elements 34 are penetrated through the corresponding reflecting plate openings, the plural top-view light-emitting elements 34 are inserted into the corresponding light guide plate openings 331.

As shown in FIG. 3, each key structure 30 comprises a keycap 301, a connecting element 302 and a triggering element 303. The keycap 301 is located over the supporting plate 31 and exposed outside the luminous keyboard 3. The keycap 301 comprises a periphery region A (see FIG. 5). In the example of FIG. 3, a letter G is shown on the keycap 301. The periphery region A denotes the region of the keycap 301 outside the letter G The connecting element 302 is arranged between the corresponding keycap 301 and the supporting plate 31. The keycap 301 is connected with the supporting plate 31 through the connecting element 302. Consequently, the keycap 301 is moved upwardly or downwardly relative to the supporting plate 31. Particularly, the connecting element 302 is connected with the corresponding keycap 301 and the plural hooks 312 of the supporting plate 31. The triggering element 303 is arranged between the corresponding keycap 301 and the switch circuit board 32. While the keycap 301 is depressed and moved downwardly to push the triggering element 303, the triggering element 303 is subjected to deformation to trigger the switch circuit board 32. When the keycap 301 is no longer depressed, no external force is applied to the keycap 301. In response to the elasticity of the triggering element 303, the triggering element 303 is restored to its original shape to provide an upward elastic restoring force to the keycap 301. In response to the upward elastic restoring force, the keycap 301 is returned to its original position where it is not depressed. In this embodiment, the connecting element 302 is a scissors-type connecting element, and the triggering element 303 is an elastomer.

Figure 4:
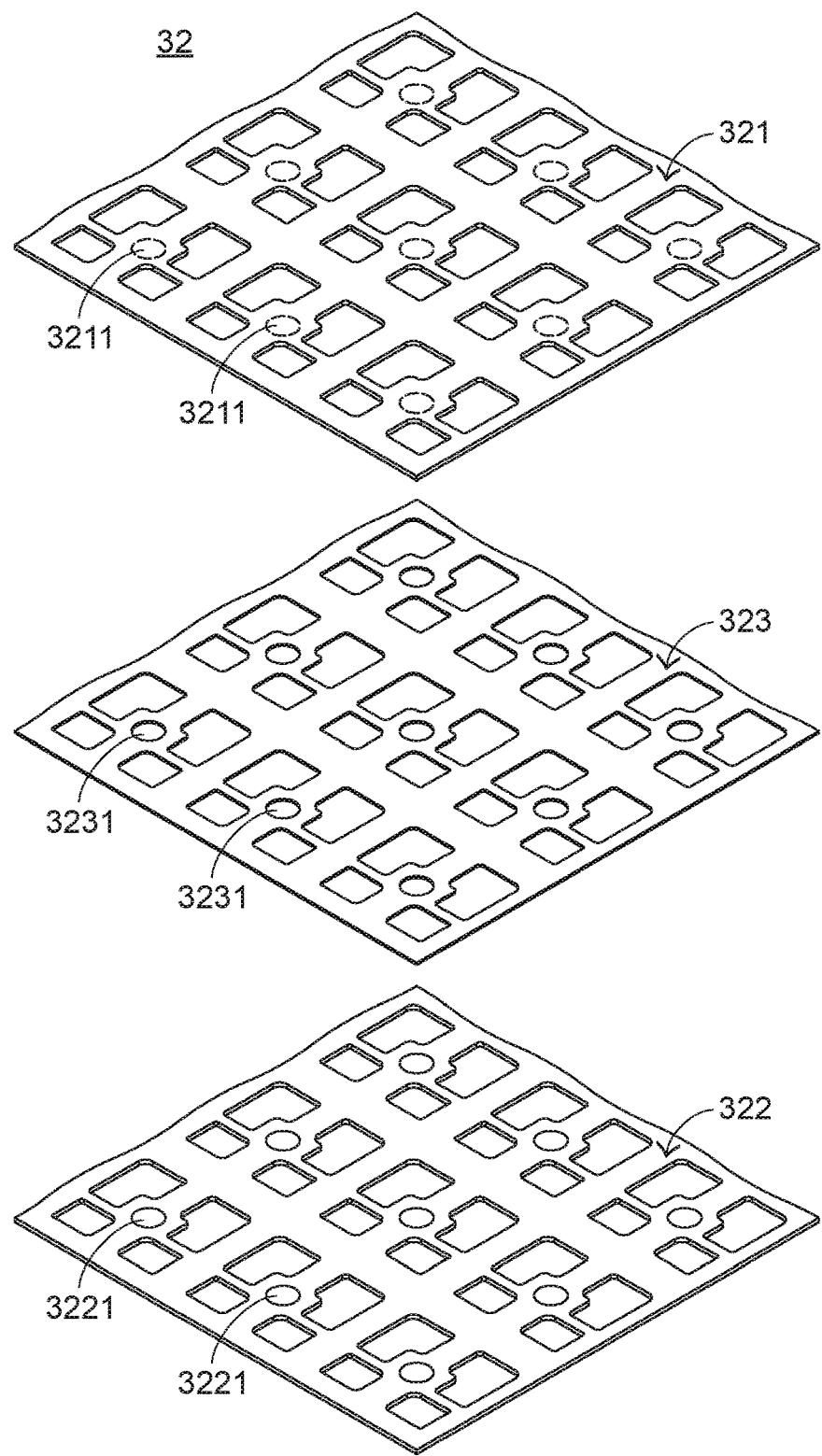
FIG. 4 is a schematic exploded view illustrating the switch circuit board of the luminous keyboard according to the first embodiment of the present invention.

FIG. 4 is a schematic exploded view illustrating the switch circuit board of the luminous keyboard according to the first embodiment of the present invention. Please refer to FIGS. 3 and 4. The switch circuit board 32 comprises an upper wiring board 321, a lower wiring board 322 and a separation layer 323. The upper wiring board 321 is contacted with the triggering element 303. Moreover, the upper wiring board 321 comprises plural upper conductive parts 3211. The plural upper conductive parts 3211 are disposed on a bottom surface of the upper wiring board 321. The first reflecting element 36 is disposed on a top surface of the upper wiring board 321 of the switch circuit board 32. The lower wiring board 322 is located under the upper wiring board 321. Moreover, the lower wiring board 322 comprises plural lower conductive parts 3221. The plural lower conductive parts 3221 are disposed on a top surface of the lower wiring board 322. For succinctness, the conductive lines for electrically connecting the upper conductive parts 3211 and the lower conductive parts 3221 are not shown in FIG. 4. The separation layer 323 is arranged between the upper wiring board 321 and the lower wiring board 322. Moreover, the separation layer 323 comprises plural separation layer openings 3231 corresponding to the plural keycaps 301. The upper conductive parts 3211 and the plural lower conductive parts 3221 are separated from each other by the separation layer 323. Moreover, plural key switches (not shown) are defined by the plural upper conductive parts 3211, the plural separation layer openings 3231 and the plural lower conductive parts 3221 collaboratively. Each key switch is aligned with one key structure 30. When the upper wiring board 321 is triggered by the triggering element 303, the corresponding upper conductive part 3211 is penetrated through the corresponding separation layer opening 3231 and contacted with the corresponding lower conductive part 3221. Consequently, the switch circuit board 32 is electrically conducted to generate the corresponding key signal.

In this embodiment, the upper conductive parts 3211 and the lower conductive parts 3221 are circular conductive blocks. It is noted that the examples of the upper conductive parts and the lower conductive parts are not restricted. For example, in some other embodiments, the upper conductive parts and the lower conductive parts are rectangular conductive blocks, triangular conductive blocks or rhombus conductive blocks. In some embodiments, each of the upper conductive parts and the lower conductive parts has a middle light-transmissible region. For example, the rectangular conductive block, the triangular conductive block or the rhombus conductive block has a hollow region that is light-transmissible and located at the middle region of the conductive block. Consequently, the light beam can be transmitted through the hollow region of the conductive block.

Figure 5:
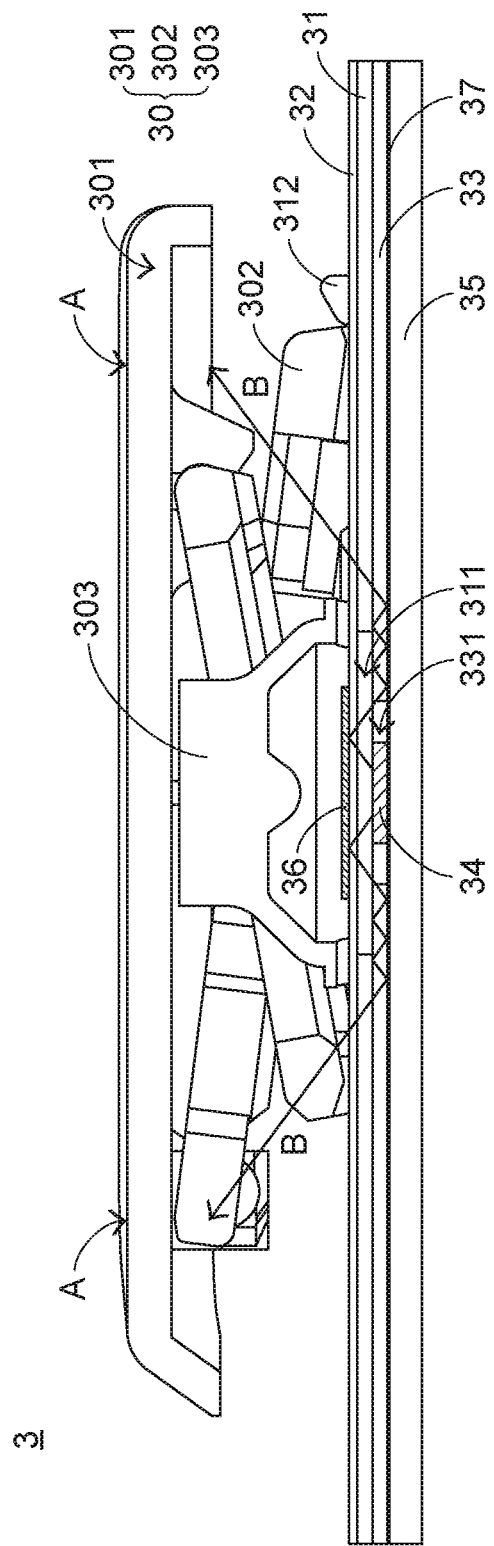
FIG. 5 is a schematic side view illustrating a portion of the luminous keyboard according to the first embodiment of the present invention.

FIG. 5 is a schematic side view illustrating a portion of the luminous keyboard according to the first embodiment of the present invention. Please refer to FIGS. 3 and 5. After the components of the luminous keyboard are assembled, the resulting structure is shown in FIG. 5. For clearly showing the optical paths of the light beams B, the connecting element 302 is not shown in FIG. 5. Moreover, as shown in FIGS. 3 and 5, the area of the first reflecting element 36 is larger than the area of a light-outputting surface of the top-view light-emitting element 34. The light-outputting surface of the top-view light-emitting element 34 faces the keycap 301. Consequently, the light beam emitted by the top-view light-emitting element 34 is projected upwardly. After the top-view light-emitting element 34 is driven to emit the light beam B, the light beam B is projected upwardly and transmitted through the supporting plate opening 311 of the supporting plate 31. After the light beam B is transmitted through the light-transmissible switch circuit board 32, the light beam B is reflected by the first reflecting element 36. The reflected light beam B is transmitted through the supporting plate opening 311 and the light guide plate opening 331 and introduced into the light guide plate 33. By the light guide plate 33, the reflected light beam B is guided to the position far away from the upper conductive part 3211 (or the lower conductive part 3221). Under this circumstance, the reflected light beam B is transmitted through the switch circuit board 32 and projected to the periphery region A of the keycap 301.

While the light beam B is guided by the light guide plate 33, a portion of the light beam B is exited from the light guide plate 33. The exited portion of the light beam B is reflected back to the light guide plate 33 by the second reflecting element 37, which is located under the light guide plate 33. From the above descriptions, the light beam B is reflected by the first reflecting element 36 and the light beam B is guided to the periphery region A of the keycap 301 by the light guide plate 33. Consequently, the luminance uniformity of the keycap 301 is enhanced, and the light beam is not very centralized.

Moreover, while the light beam B is guided by the light guide plate 33, the light beam B is subjected to total internal reflection within the light guide plate 33. Consequently, the second reflecting element 37 is not an essential component of the luminous keyboard 3. In other words, the luminous keyboard 3 is equipped with the second reflecting element or not equipped with the second reflecting element.

Figure 6:
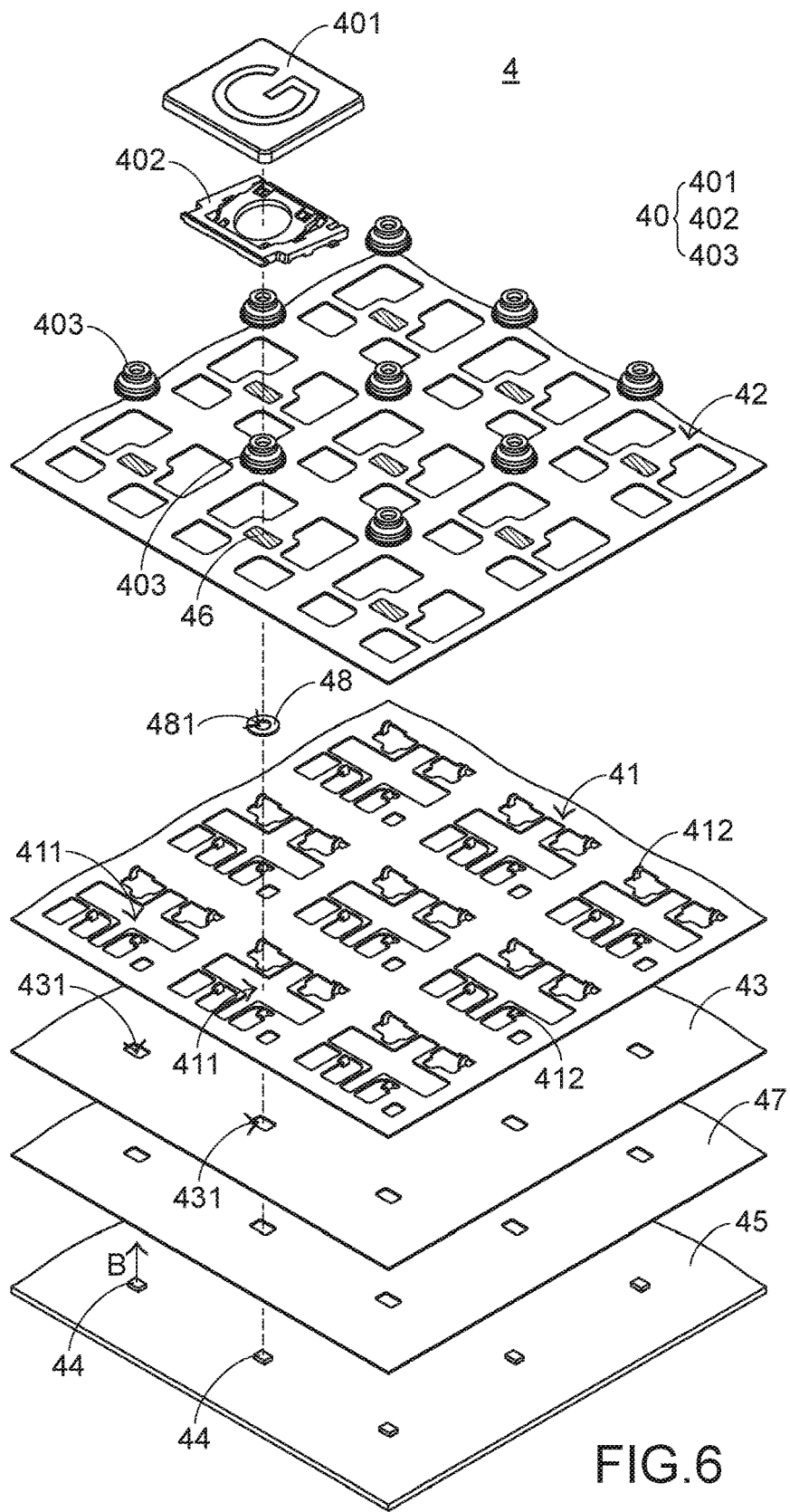
FIG. 6 is a schematic exploded view illustrating a portion of a luminous keyboard according to a first embodiment of the present invention.
Figure 7:
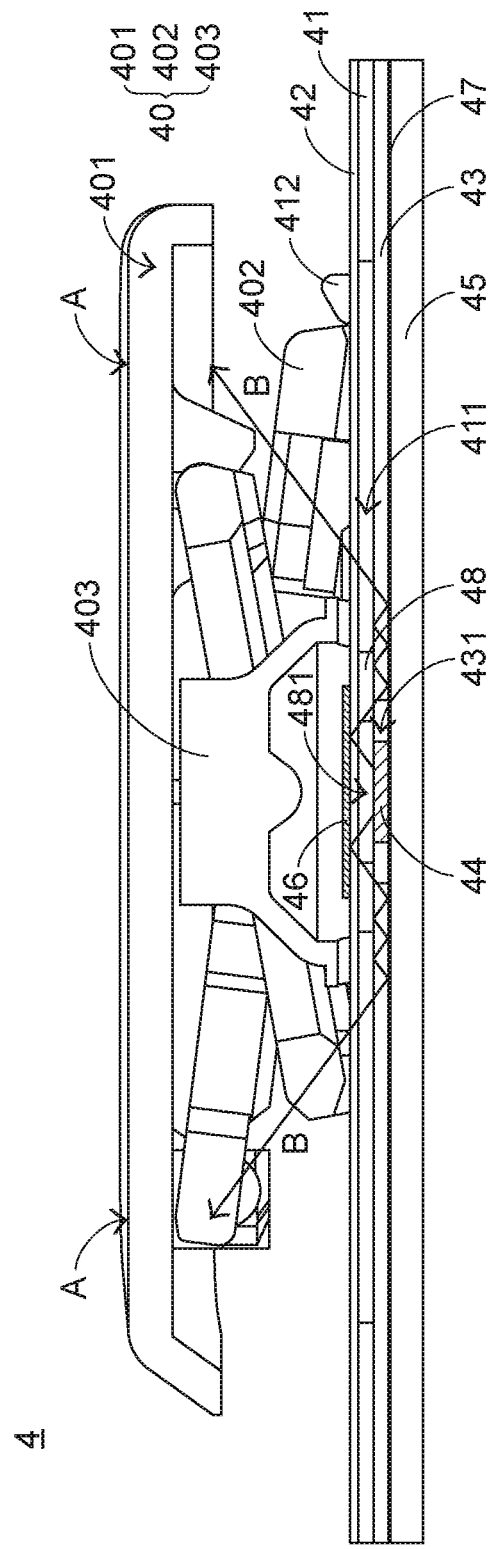
FIG. 7 is a schematic side view illustrating a portion of the luminous keyboard according to the second embodiment of the present invention.

The present invention further provides a second embodiment, which is distinguished from the first embodiment. FIG. 6 is a schematic exploded view illustrating a portion of a luminous keyboard according to a first embodiment of the present invention. FIG. 7 is a schematic side view illustrating a portion of the luminous keyboard according to the second embodiment of the present invention. As shown in FIGS. 6 and 7, the luminous keyboard 4 comprises plural key structures 40, a supporting plate 41, a switch circuit board 42, a light guide plate 43, plural top-view light-emitting elements 44, an illumination circuit board 45, plural first reflecting elements 46, a second reflecting element 47 and plural supporting slices 48. For succinctness, only one key structure 40 is shown in the drawings. Each key structure 40 comprises a keycap 401, a connecting element 402 and a triggering element 403. Moreover, the supporting plate 41 comprises plural supporting plate openings 411 and plural hooks 412 corresponding to the plural key structures 40. The light guide plate 43 comprises plural light guide plate openings 431 corresponding to the plural key structures 40. For succinctness, only one light guide plate opening 431 is shown in the drawings. Except for the following two aspects, the structures of the luminous keyboard 4 of this embodiment are substantially identical to those of the luminous keyboard 3 of the first embodiment. Firstly, the structure of the supporting plate 41 is distinguished. Secondly, the luminous keyboard 4 further comprises the plural supporting slices 48.

The plural supporting plate openings 411 of the supporting plate 41 are shown in FIG. 6. It is found that the supporting plate opening 411 is larger than the supporting plate opening 311 of the first embodiment. Consequently, a greater amount of the light beam B can pass through the supporting plate opening 411. That is, the light amount projected to the key structure 40 is increased. Since the supporting plate opening 411 is larger, the region of the switch circuit board 42 corresponding to the supporting plate opening 411 cannot be supported by the supporting plate 41. If no measure is taken, the switch circuit board 42 cannot be triggered successfully. For solving this drawback, the supporting slices 48 are aligned with the corresponding supporting plate openings 411. In this embodiment, the supporting slices 48 are disposed on a bottom surface of the lower wiring board (not shown) of the switch circuit board 42. The supporting slices 48 are inserted into the corresponding supporting plate openings 411 and contacted with the light guide plate 43 in order to support the regions of the switch circuit board 42 corresponding to the supporting plate openings 411. Moreover, each supporting slice 48 comprises a supporting slice opening 481. As shown in FIG. 7, the corresponding top-view light-emitting element 44 is inserted into the supporting slice opening 481. Moreover, the supporting slice 48 is made of a light-transmissible material for allowing the light beam B to pass through.

The travelling path of the light beam B will be described as follows. After the top-view light-emitting element 44 is driven to emit the light beam B, the light beam B is projected upwardly and transmitted through the supporting plate opening 411 of the supporting plate 41 and the supporting slice opening 481 of the supporting slice 48. After the light beam B is transmitted through the light-transmissible switch circuit board 42, the light beam B is reflected by the first reflecting element 46. The reflected light beam B is transmitted through the supporting plate opening 411, the supporting slice 48 and the light guide plate opening 431, and introduced into the light guide plate 43. By the light guide plate 43, the reflected light beam B is guided to the position far away from the upper conductive part (not shown). Under this circumstance, the reflected light beam B is transmitted through the switch circuit board 42 and projected to the periphery region A of the keycap 401. While the light beam B is guided by the light guide plate 43, a portion of the light beam B is exited from the light guide plate 43. The exited portion of the light beam B is reflected back to the light guide plate 43 by the second reflecting element 47, which is located under the light guide plate 43.

From the above descriptions, the luminous keyboard of the present invention uses the top-view light-emitting elements. The top-view light-emitting elements and the key structures are in a one-to-one relationship. Consequently, the illumination of individual key structures can be controlled. Moreover, the top-view light-emitting elements are inserted into the corresponding light guide plate openings and located under the supporting plate openings and the switch circuit board. The first reflecting element is arranged between the key structure and the top-view light-emitting element. Consequently, the light beam is not directly projected to the key structure. After the light beam emitted by the top-view light-emitting element is transmitted through the supporting plate opening, the light beam is transmitted through the switch circuit board and reflected to the light guide plate by the reflecting element. Then, the light beam is guided by the light guide plate and projected to the periphery region of the key structure. Consequently, the luminous keyboard of the present invention can produces enhanced luminance uniformity.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all modifications and similar structures.

What is claimed is:
1. A luminous keyboard, comprising:
a key structure exposed outside the luminous keyboard;

a supporting plate located under the key structure and connected with the key structure, wherein the supporting plate comprises a supporting plate opening;

a switch circuit board located over the supporting plate, wherein when the switch circuit board is triggered by the key structure, a key signal is generated;

a light guide plate located under the supporting plate, wherein the light guide plate comprises a light guide plate opening;

a top-view light-emitting element located under the key structure and inserted into the light guide plate opening, wherein the top-view light-emitting element emits a light beam; and a reflecting element aligned with the top-view light-emitting element, and arranged between the key structure and the top-view light-emitting element, wherein after the light beam is transmitted through the supporting plate opening, the light beam is reflected to the light guide plate by the reflecting element and the light beam is guided to a periphery region of the key structure by the light guide plate, wherein the key structure comprises:

a keycap located over the supporting plate and exposed outside the luminous keyboard, wherein the periphery region of the key structure is located at the keycap;

a connecting element arranged between the keycap and the supporting plate, wherein the keycap is connected with the supporting plate through the connecting element, so that the keycap is movable upwardly or downwardly relative to the supporting plate; and a triggering element arranged between the keycap and the switch circuit board, wherein while the keycap is depressed to push the triggering element, the switch circuit board is triggered by the triggering element, wherein the switch circuit board comprises:

an upper wiring board contacted with the triggering element, wherein the upper wiring board comprises an upper conductive part;

a lower wiring board located under the upper wiring board, wherein the lower wiring board comprises a lower conductive part; and a separation layer arranged between the upper wiring board and the lower wiring board, wherein the upper conductive part and the lower conductive part are separated from each other by the separation layer, and the separation layer comprises a separation layer opening, wherein when the upper wiring board is triggered by the triggering element, the upper conductive part is penetrated through the separation layer opening and contacted with the lower conductive part, so that the switch circuit board generates the key signal, wherein the reflecting element is printed or coated on a top surface of the upper wiring board, and an area of the reflecting element is larger than an area of a light-outputting surface of the top-view light-emitting element.

2. The luminous keyboard according to claim 1, further comprising an additional reflecting element between the light guide plate and the illumination circuit board, wherein after the light beam is exited from the light guide plate, the light beam is reflected by the additional reflecting element, so that the light beam is reflected back into the light guide plate.

3. The luminous keyboard according to claim 1, further comprising an illumination circuit board under the light guide plate, wherein the top-view light-emitting element is supported by the illumination circuit board, and the illumination circuit board is electrically connected with the top-view light-emitting element, wherein a light-outputting surface of the top-view light-emitting element faces the keycap.

4. The luminous keyboard according to claim 3, wherein the illumination circuit board is a printed circuit board or a flexible printed circuit.

5. The luminous keyboard according to claim 1, further comprising a supporting slice, wherein the supporting slice is aligned with the supporting plate opening and disposed on a bottom surface of the lower wiring board, wherein the supporting slice is inserted into the supporting plate opening and contacted with the light guide plate, so that the switch circuit board is supported by the supporting slice.

6. The luminous keyboard according to claim 5, wherein the supporting slice comprises a supporting slice opening, and the top-view light-emitting element is inserted into the supporting slice opening.

7. The luminous keyboard according to claim 5, wherein the supporting slice is made of a light-transmissible material, so that the light beam is transmissible through the supporting slice.

\* \* \* \* \*